United States Patent [19]
Akram et al.

[11] Patent Number: 6,051,878
[45] Date of Patent: Apr. 18, 2000

[54] METHOD OF CONSTRUCTING STACKED PACKAGES

[75] Inventors: Salman Akram, Boise; Jerry M. Brooks, Caldwell, both of Id.

[73] Assignee: Micron Technology, Inc., Boise, Id.

[21] Appl. No.: 09/233,997

[22] Filed: Jan. 19, 1999

Related U.S. Application Data

[62] Division of application No. 08/813,467, Mar. 10, 1997.

[51] Int. Cl.[7] .................................................. H01L 23/02
[52] U.S. Cl. .......................... 257/686; 257/685; 257/678; 257/778; 361/735; 361/729; 361/790; 361/784
[58] Field of Search ..................................... 257/685, 686, 257/723, 777, 778, 678; 361/790, 792, 803, 735, 729, 784

[56] References Cited

U.S. PATENT DOCUMENTS

| | | | |
|---|---|---|---|
| 4,954,878 | 9/1990 | Fox et al. ................................. | 257/675 |
| 5,099,306 | 3/1992 | Dunaway et al. ....................... | 257/666 |
| 5,109,320 | 4/1992 | Bourdelaise et al. ................... | 361/785 |
| 5,128,831 | 7/1992 | Fox, III et al. .......................... | 361/735 |
| 5,222,014 | 6/1993 | Lin .......................................... | 361/414 |
| 5,252,857 | 10/1993 | Kane et al. ............................... | 257/686 |
| 5,291,061 | 3/1994 | Ball ......................................... | 257/686 |
| 5,300,801 | 4/1994 | Blalock et al. .......................... | 257/309 |
| 5,323,060 | 6/1994 | Fogal et al. ............................. | 257/777 |
| 5,403,784 | 4/1995 | Hashemi et al. ......................... | 29/827 |
| 5,422,435 | 6/1995 | Takiar et al. ............................. | 174/52 |
| 5,434,745 | 7/1995 | Shokrgozar et al. .................... | 257/686 |
| 5,466,627 | 11/1995 | Lur et al. ................................. | 438/396 |
| 5,473,814 | 12/1995 | White ...................................... | 29/840 |
| 5,477,082 | 12/1995 | Buckley, III et al. ................... | 368/697 |
| 5,481,134 | 1/1996 | Sobhani et al. ......................... | 257/686 |
| 5,494,841 | 2/1996 | Dennison et al. ....................... | 438/210 |
| 5,495,398 | 2/1996 | Takiar et al. ............................. | 361/790 |
| 5,496,775 | 3/1996 | Brooks .................................... | 438/127 |
| 5,498,902 | 3/1996 | Hara ........................................ | 257/686 |
| 5,498,905 | 3/1996 | Young ...................................... | 257/700 |
| 5,506,756 | 4/1996 | Haley ....................................... | 361/789 |
| 5,508,565 | 4/1996 | Hatakeyama et al. .................. | 257/777 |
| 5,512,765 | 4/1996 | Gaverick ................................. | 257/202 |
| 5,512,780 | 4/1996 | Davidson ................................ | 257/668 |
| 5,513,076 | 4/1996 | Werther ................................... | 361/784 |
| 5,535,101 | 7/1996 | Miles et al. ............................. | 361/808 |
| 5,594,275 | 1/1997 | Kwon et al. ............................. | 257/686 |
| 5,639,696 | 6/1997 | Liang et al. ............................. | 437/209 |
| 5,705,858 | 1/1998 | Tsukamoto .............................. | 257/778 |
| 5,715,144 | 2/1998 | Ameen et al. ........................... | 361/790 |
| 5,728,606 | 3/1998 | Laine et al. .............................. | 438/122 |
| 5,729,440 | 3/1998 | Jimarez et al. .......................... | 361/779 |

*Primary Examiner*—Tom Thomas
*Assistant Examiner*—Luan Thai
*Attorney, Agent, or Firm*—Trask, Britt & Rossa

[57] ABSTRACT

A semiconductor package comprising multiple stacked substrates having flip chips attached to the substrates with chip on board assembly techniques to achieve dense packaging. The substrates are preferably stacked atop one another by electric connections which are column-like structures. The electric connections achieve electric communication between the stacked substrates, must be of sufficient height to give clearance for the components mounted on the substrates, and should preferably be sufficiently strong enough to give support between the stacked substrates.

32 Claims, 5 Drawing Sheets

METHOD OF CONSTRUCTING STACKED PACKAGES

CROSS REFERENCE TO RELATED APPLICATION

This application is a divisional of application Ser. No. 08/813,467, filed Mar. 10, 1997, pending.

BACKGROUND OF THE INVENTION

1. Field of the Invention

The present invention relates to an apparatus and a method for increasing semiconductor device density. In particular, the present invention relates to a stacked multi-substrate device using a combination of flip chips and chip on board assembly techniques to achieve densely packaged semiconductor devices.

2. State of the Art

Chip On Board techniques are used to attach semiconductor dice to a printed circuit board, including flip chip attachment, wirebonding, and tape automated bonding ("TAB"). Flip chip attachment consists of attaching a flip chip to a printed circuit board or other substrate. A flip chip is a semiconductor chip that has a pattern or array of electrical terminations or bond pads spaced around an active surface of the flip chip for face down mounting of the flip chip to a substrate. Generally, the flip chip has an active surface having one of the following electrical connectors: Ball Grid Array ("BGA")—wherein an array of minute solder balls is disposed on the surface of a flip chip that attaches to the substrate ("the attachment surface"); Slightly Larger than Integrated Circuit Carrier ("SLICC")—which is similar to a BGA, but having a smaller solder ball pitch and diameter than a BGA; or a Pin Grid Array ("PGA")—wherein an array of small pins extends substantially perpendicularly from the attachment surface of a flip chip. The pins conform to a specific arrangement on a printed circuit board or other substrate for attachment thereto. With the BGA or SLICC, the solder or other conductive ball arrangement on the flip chip must be a mirror-image of the connecting bond pads on the printed circuit board such that precise connection is made. The flip chip is bonded to the printed circuit board by refluxing the solder balls. The solder balls may also be replaced with a conductive polymer. With the PGA, the pin arrangement of the flip chip must be a mirror-image of the pin recesses on the printed circuit board. After insertion, the flip chip is generally bonded by soldering the pins into place. An under-fill encapsulant is generally disposed between the flip chip and the printed circuit board for environmental protection and to enhance the attachment of the flip chip to the printed circuit board. A variation of the pin-in-recess PGA is a J-lead PGA, wherein the loops of the J's are soldered to pads on the surface of the circuit board.

Wirebonding and TAB attachment generally begin with attaching a semiconductor chip to the surface of a printed circuit board with an appropriate adhesive, such as an epoxy. In wirebonding, bond wires are attached, one at a time, to each bond pad on the semiconductor chip and extend to a corresponding lead or trace end on the printed circuit board. The bond wires are generally attached through one of three industry-standard wirebonding techniques: ultrasonic bonding—using a combination of pressure and ultrasonic vibration bursts to form a metallurgical cold weld; thermo-compression bonding—using a combination of pressure and elevated temperature to form a weld; and thermosonic bonding—using a combination of pressure, elevated temperature, and ultrasonic vibration bursts. The semiconductor chip may be oriented either face up or face down (with its active surface and bond pads either up or down with respect to the circuit board) for wire bonding, although face up orientation is more common. With TAB, ends of metal leads carried on an insulating tape such as a polyamide are respectively attached to the bond pads on the semiconductor chip and to the lead or trace ends on the printed circuit board. An encapsulant is generally used to cover the bond wires and metal tape leads to prevent contamination.

Higher performance, lower cost, increased miniaturization of components, and greater packaging density of integrated circuits are ongoing goals of the computer industry. As new generations of integrated circuit products are released, the number of devices used to fabricate them tends to decrease due to advances in technology even though the functionality of these products increases. For example, on the average, there is approximately a 10 percent decrease in components for every product generation over the previous generation with equivalent functionality.

In integrated circuit packaging, in addition to component reduction, surface mount technology has demonstrated an increase in semiconductor chip density on a single substrate or board despite the reduction of the number of components. This results in more compact designs and form factors and a significant increase in integrated circuit density. However, greater integrated circuit density is primarily limited by the space or "real estate" available for mounting dice on a substrate, such as a printed circuit board.

One method of further increasing integrated circuit density is to stack semiconductor dice vertically. U.S. Pat. No. 5,012,323 issued Apr. 30, 1991 to Farnworth teaches combining a pair of dice mounted on opposing sides of a lead frame. An upper, smaller die is back-bonded to the upper surface of the leads of the lead frame via a first adhesively coated, insulated film layer. A lower, larger die is face-bonded to the lower lead frame die-bonding region via a second, adhesively coated, insulative film layer. The wire-bonding pads on both upper die and lower die are interconnected with the ends of their associated lead extensions with gold or aluminum bond wires. The lower die must be slightly larger than the upper die such that the die pads are accessible from above through a bonding window in the lead frame such that gold wire connections can be made to the lead extensions. This arrangement has a major disadvantage from a production standpoint as the same size die cannot be used.

U.S. Pat. No. 5,291,061 issued Mar. 1, 1994 to Ball ("Ball") teaches a multiple stacked dice device containing up to four stacked dice supported on a die-attach paddle of a lead frame, the assembly not exceeding the height of current single die packages, and wherein the bond pads of each die are wirebonded to lead fingers. The low profile of the device is achieved by close-tolerance stacking which is made possible by a low-loop-profile wirebonding operation and thin adhesive layers between the stacked dice. However, Ball requires long bond wires to electrically connect the stacked dice to the lead frame. These long bond wires increase resistance and may result in bond wire sweep during encapsulation. Also, Ball requires the use of spacers between the dice.

U.S. Pat. No. 5,323,060 issued Jun. 21, 1994 to Fogal et al. ("Fogal") teaches a multichip module that contains stacked die devices, the terminals or bond pads of which are wirebonded to a substrate or to adjacent die devices. However, as discussed with Ball, Fogal requires long bond wires to electrically connect the stacked die bond pads to the substrate. Fogal also requires the use of spacers between the dice.

U.S. Pat. Nos. 5,422,435 and 5,495,398 to Takiar et al. ("Takiar") teach stacked dice having bond wires extending to each other and to the leads of a carrier member such as a lead frame. However, Takiar also has the problem of long bond wires, as well as, requiring specific sized or custom designed dice to achieve a properly stacked combination.

U.S. Pat. No. 5,434,745 issued Jul., 18, 1995 to Shokrgozar et al. ("Shokrgozar") discloses a stackable packaging module comprising a standard die attached to a substrate with a spacer frame placed on the substrate to surround the die. The substrate/die/spacer combinations are stacked one atop another to form a stacked assembly. The outer edge of the spacer frame has grooves in which a conductive epoxy is disposed. The conductive epoxy forms electric communication between the stacked layers and/or to the final substrate to which the stacked assembly is attached. However, Shokrgozar requires specialized spacer frames and a substantial number of assembly steps, both of which increase the cost of the final assembly.

U.S. Pat. No. 5,128,831 issued Jul. 7, 1992 to Fox, III et al. ("Fox") also teaches a standard die attached to a substrate with a spacer frame placed on the substrate to surround the die. The stacked layers and/or the final substrate are in electric communication with conductive vias extending through the spacer frames. However, Fox also requires specialized spacer frames, numerous assembly steps, and is limited in its flexibility to utilize a variety of dice.

U.S. Pat. No. 5,513,076 issued Apr. 30, 1996 to Wether ("Wether") teaches the use of interconnecting assemblies to connect integrated circuits in an integrated manner.

As has been illustrated, none of the cited prior art above uses or teaches flip-chip manufacturing methods for attaching dice together in a stacked manner to form a stacked die assembly.

Therefore, it would be advantageous to develop a stacking technique and assembly for increasing integrated circuit density using a variety of non-customized die configurations in combination with commercially-available, widely-practiced semiconductor device fabrication techniques.

BRIEF SUMMARY OF THE INVENTION

The present invention relates to a stacked multisubstrate device using combined flip chips and chip on board assembly techniques to achieve densely packaged semiconductor devices, and a method for making same. In this invention, multiple substrates are stacked atop one another. The substrates can include a plurality of semiconductor dice disposed on either surface of the substrates. The substrates can be structures of planar non-conductive material, such as fiberglass material used for PCBs, or may even be semiconductor dice. For the sake of clarity, the term "substrate", as used hereinafter, will be defined to include planar non-conductive materials and semiconductor dice. The substrates are preferably stacked atop one another by electric connections which are ball or column-like structures. Alternately, solder bumps or balls may be formed on the substrate. The electric connections achieve electric communication between the stacked substrates. The electric connections can be formed from industry standard solder forming techniques or from other known materials and techniques such as conductive adhesives, Z-axis conductive material, flex-contacts, spring contacts, wire bonds, TAB tape, and the like. The electric connections must be of sufficient height to give clearance for the components mounted on the substrates and should be sufficiently strong enough to give support between the stacked substrates.

A preferred embodiment comprises a base substrate, having first and opposing surfaces, and means for electrical connection with external components or substrates, wherein the electrical connection means extends at least from the first surface of the base substrate. The base substrate opposing surface, the other side of the substrate, also includes a plurality of bond pads disposed thereon. Additionally, at least one semiconductor component may be attached to the opposing surface of the base substrate. The semiconductor components are preferably flip chips that are in electrical communication with electrical traces on or within the base substrate with any convenient known chip-on-board (COB) or direct-chip-attachment (DCA) technique (i.e., flip chip attachment, wirebonding, and TAB). Other techniques, such as the use of two-axis materials or conductive epoxies, can also be used for connections between either substrates or substrates and semiconductor chips. The electrical traces form a network of predetermined electrical connections between the base substrate electrical connection means, the base substrate bond pads, and/or the base substrate semiconductor components.

The preferred embodiment further comprises a stacked substrate. The stacked substrate has a first surface and an opposing surface. A plurality of bond pads may be disposed on the stacked substrate first surface and/or the stacked substrate opposing surface. At least one semiconductor component is attached to each of the stacked substrate first surface and the stacked substrate opposing surface. The semiconductor components are preferably flip chips which are in electrical communication with electrical traces on or within the first stacked substrate. The electrical traces form a network of predetermined electrical connections between the stacked substrate first surface bond pads, the stacked substrate opposing surface bond pads, and/or the stacked substrate semiconductor components.

The stacked substrate is attached to the base substrate through a plurality of electric connections. The electric connections can be column-like structures or spherical structures (balls) that support and form electrical communication between the base substrate bond pads and either the stacked substrate first surface bond pads or the stacked substrate opposing surface bond pads (depending upon which stacked substrate surface faces the base substrate first surface). The electric connections are preferably distributed evenly around a periphery of the base and stacked substrates. However, the electric connections may be of any distribution so long as adequate mechanical support exists between the base substrate and the stacked substrate.

In the manner discussed for the stacked substrate, additional stacked substrates may be attached to and stacked above the stacked substrate. Thus, with this technique, a multiple stacked substrate component may be formed. It is, of course, understood that the electrical connection means extending from the base substrate first surface for communication with an outside substrate may not be necessary if the multiple stacked substrate is in and of itself a complete component.

An alternative embodiment comprises substrates of varying size in a single assembly. The variable size substrate assembly is constructed in the manner discussed above. However, the variable size substrate assembly includes smaller sized substrates than the previously discussed base and stacked substrate. The smaller substrate is essentially identical to the previously discussed stacked substrate. The smaller substrate comprises a first surface and an opposing surface with a plurality of bond pads which may be disposed on the smaller substrate first surface and/or the smaller substrate opposing surface. At least one semiconductor component may be attached to the smaller substrate first surface and/or the smaller substrate opposing surface. The semiconductor components are in electrical communication with electrical traces on or within the first stacked substrate. The electrical traces form a network of predetermined electrical connections between the smaller substrate first surface bond pads, the smaller substrate opposing surface bond pads, and/or the smaller substrate semiconductor components.

The smaller substrate may be disposed between the base substrate and the stacked substrate. The smaller substrate is attached to either the base substrate or the stacked substrate through a plurality of electric connections. The electric connections form electrical communication between the base substrate bond pads and the smaller substrate bond pads or between the stacked substrate bond pads and the smaller substrate bond pads (depending upon whether the smaller substrate is attached to the base substrate or the stacked substrate). The smaller substrate may also be attached to the opposite surface of the stacked substrate and multiple smaller substrates may be attached in various positions on any substrate in the variable size substrate assembly.

Thus, the present invention offers the advantages of and achieves superior and improved electrical properties and speed of submodules and the entire module assembly, achieves higher density input/output configurations and locations (array), achieves higher density of devices or complexities of integrated circuits because of optimum input/output locations, results in improved thermal performance, allows easier repair and reusability, and allows easier modification of the package.

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE INVENTION

Figure 1:
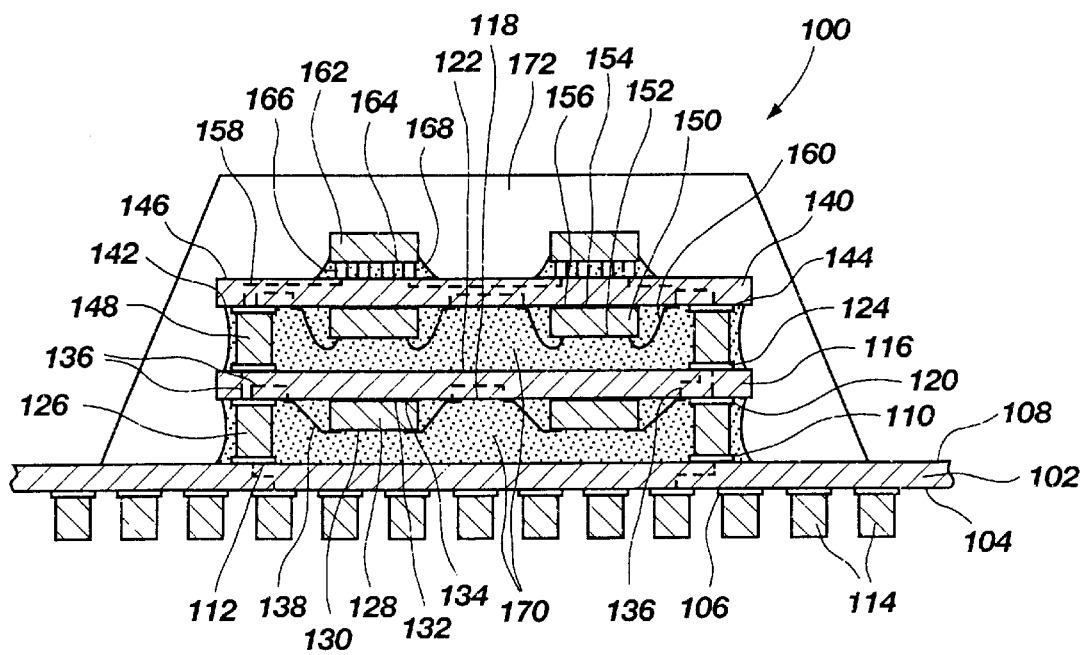
FIG. 1 is a side cross-sectional view of a first stacked assembly of the present invention.

FIG. 1 illustrates a first stacked assembly 100 of the present invention. The stacked assembly 100 comprises a base substrate 102 having a first surface 104 with a plurality of bond pads 106 disposed thereon and a second surface 108 with a plurality of bond pads 110 disposed thereon. Each of the base substrate first surface bond pads 106 is in electrical communication with its respective base substrate second surface bond pad 110 via a plurality of lead traces 112 extending through the base substrate 102. A plurality of electric connections 114 extends from the base substrate first surface bond pads 106. The base substrate electric connections 114 make contact with the other components or substrates.

The stacked assembly 100 further includes a first stacked substrate 116 having a first surface 118 with a plurality of bond pads 120 and a second surface 122 with a plurality of bond pads 124 disposed thereon. The first stacked substrate 116 is in electrical communication with the base substrate second surface 108 via a plurality of first electric connections 126. The first electric connections 126 extend between each first stacked substrate first surface bond pad 120 and its respective base substrate second surface bond pad 110. The bond pads of both the first stacked substrate 116 and base substrate 102 are preferably located such that each respective bond pad pair aligns perpendicularly.

A plurality of first semiconductor dice 128 each having a face side 130 and a back side 132 is attached to each of the first stacked substrate first surface 118 and the first stacked substrate second surface 122 with a first layer of adhesive 134 applied to the first semiconductor die back sides 132. The first semiconductor dice 128 are in electrical contact with a plurality of first stacked substrate electrical traces 136 via TAB bonds 138. The first stacked substrate electrical traces 136 extend in or on the first stacked substrate 116 and may contact the first stacked substrate first surface bond pad 120, the first stacked substrate second surface bond pad 124, and/or another first semiconductor die 128.

The stacked assembly 100 still further includes a second stacked substrate 140 having a first surface 142 with a plurality of bond pads 144 thereon and a second surface 146. The second stacked substrate 140 is in electrical communication with the first stacked substrate second surface 122 via a plurality of second electric connections 148. The second electric connections 148 extend between each second stacked substrate first surface bond pad 144 and its respective first stacked substrate second surface bond pad 124. The bond pads of both the second stacked substrate 140 and first stacked substrate 116 are preferably located such that each respective bond pad pair aligns perpendicularly.

A plurality of second semiconductor dice 150 each having a face side 152 and a back side 154 is attached to the second stacked substrate first surface 142 with a second layer of adhesive 156 applied to the second semiconductor die back sides 154. The second semiconductor dice 150 are in electrical contact with a plurality of second stacked substrate electrical traces 158 via wirebonds 160. A plurality of third semiconductor dice 162 each having a face side 164 is attached to the second stacked substrate second surface 146 with a plurality of flip chip contacts 166, such as BGA, PGA or the like. The flip chip contacts 166 are in electrical contact with the second stacked substrate electrical traces 158. The second stacked substrate electrical traces 158 extend in or on the second stacked substrate 140 and may contact the second stacked substrate first surface bond pads 144, the second semiconductor dice 150 and/or another third semiconductor die 162.

A flip chip dielectric material 168 may be disposed between the third semiconductor dice face side 164 and the second stacked substrate second surface 146. Additionally, a dielectric material 170 may be disposed between the base substrate 102 and the first stacked substrate 116, and/or the first stacked substrate 116 and the second stack substrate 140. Furthermore, an encapsulation material 172 may cover the stack dice portion of the stacked assembly 100.

It is, of course, understood that any available substrate surface, such as the base substrate second surface 108, may have semiconductor dice attached thereto.

Figure 2:
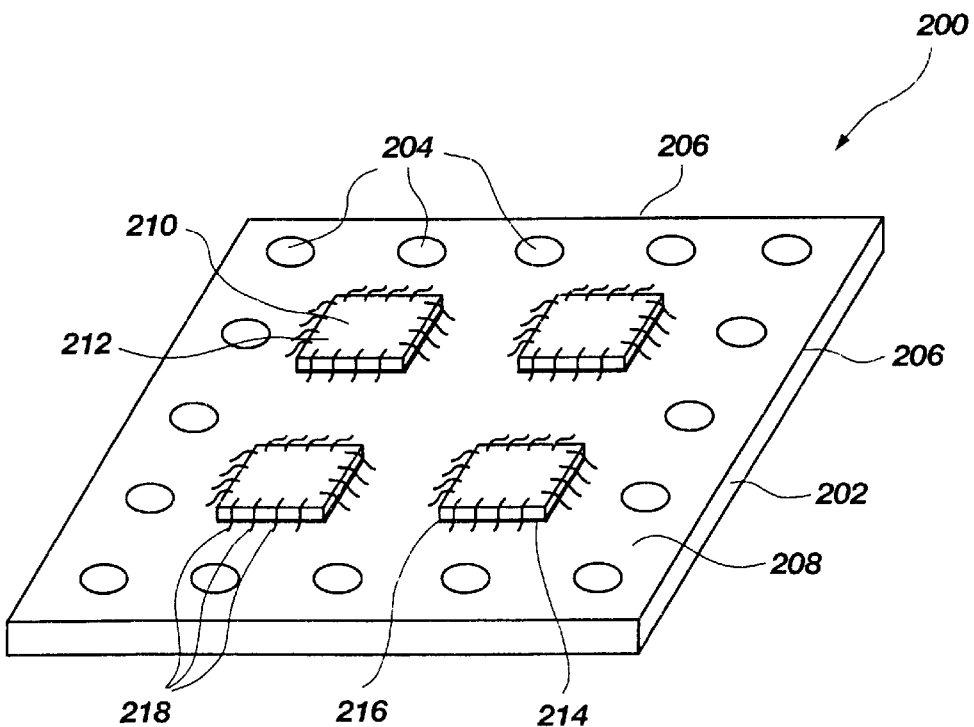
FIG. 2 is a perspective view of a substrate of the present invention which has uniform periphery bond pads.

FIG. 2 illustrates a substrate assembly 200 having a uniform bond pad arrangement, such as shown as the first surface 142 of the second stacked substrate 140 in FIG. 1. The substrate assembly 200 comprises a substrate 202 with a plurality of bond pads 204 distributed about a periphery 206 of a surface 208 of the substrate 202. A plurality of semiconductor dice 210 is disposed on the substrate surface 208 within the bond pads 204. The semiconductor dice 210 have a face side 212 and a back side 214. The semiconductor dice 210 are attached by an adhesive layer 216 applied to the semiconductor dice back side 214 and make electrical contact with the substrate surface 208 by a plurality of bond wires 218. Such an arrangement of bond pads 204 yields a strong, well-supported structure.

Figure 3:
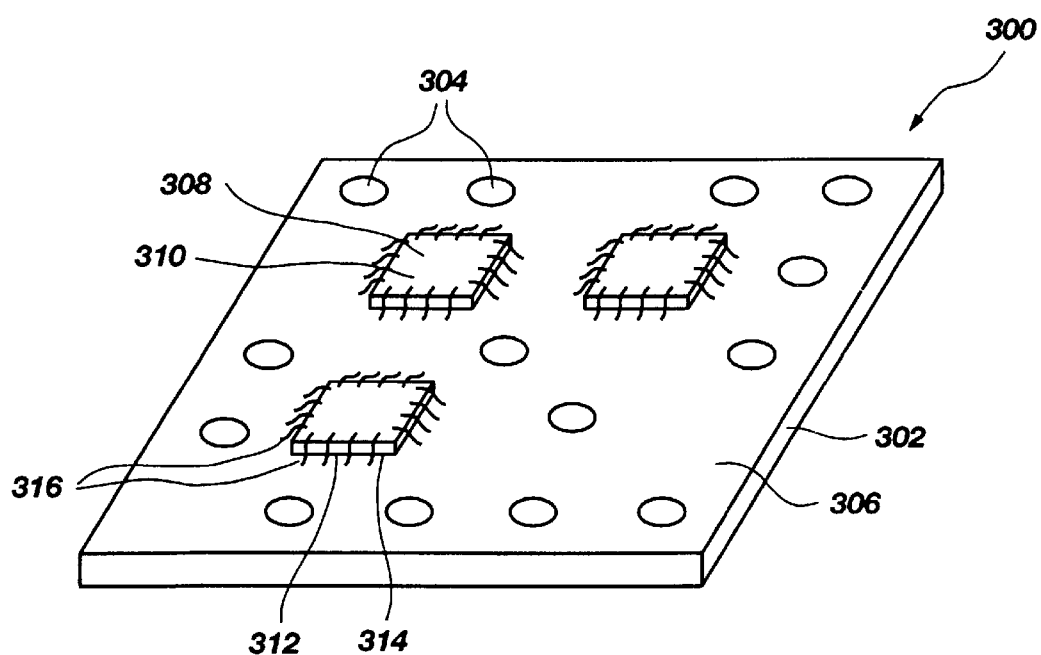
FIG. 3 is a perspective view of a substrate of the present invention which has nonuniform bond pads.

The distribution of the bond pads and the semiconductor dice need not be uniform, so long as the distribution allows adequate support between substrates. FIG. 3 illustrates a substrate assembly 300 having a non-uniform bond pad arrangement. The substrate assembly 300 comprises a substrate 302 with a plurality of bond pads 304 distributed in a non-uniform pattern across a surface 306 of the substrate 302. A plurality of semiconductor dice 308 is disposed on the substrate surface 306. The semiconductor dice 308 have a face side 310 and a back side 312. The semiconductor dice 308 are attached by an adhesive layer 314 applied to the semiconductor dice back side 312 and make electrical contact with the substrate surface 306 by a plurality of bond wires 316.

Figure 4:
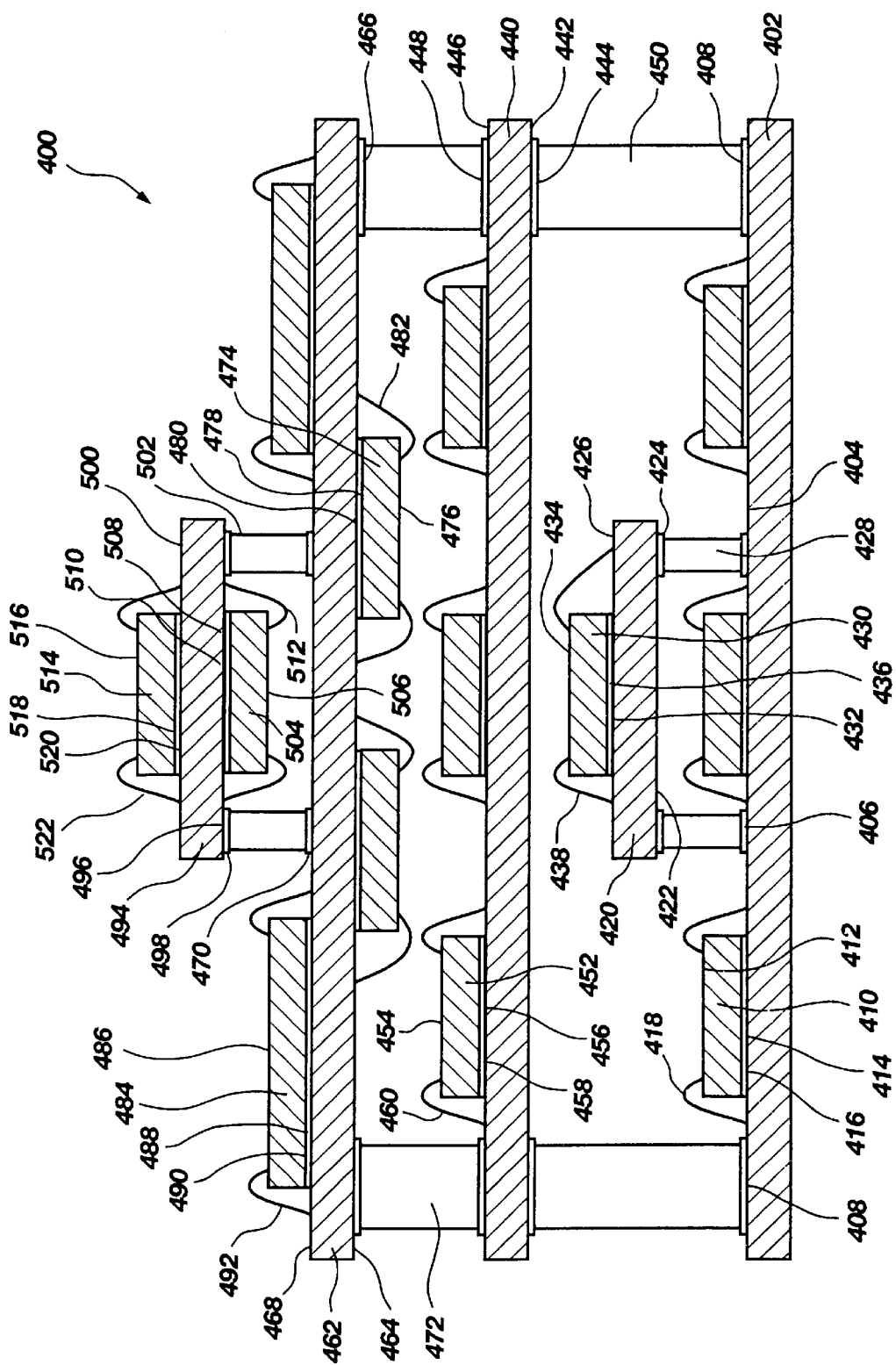
FIG. 4 is a side cross-sectional view of a variable stack size assembly of the present invention.

FIG. 4 illustrates a variable stack size assembly 400 of the present invention. The variable stack size assembly 400 comprises a first stacked substrate 402 having a surface 404 with a plurality of first bond pads 406 and second bond pads 408 disposed thereon. A plurality of first semiconductor dice 410 each having a face side 412 and a back side 414 is attached to the first stacked substrate surface 404 with a first layer of dielectric adhesive 416 applied to the first semiconductor die back sides 414. The first semiconductor dice 410 are in electric communication with a plurality of first stacked substrate electrical traces (not shown) via wirebonds 418.

The variable stack size assembly 400 further includes a first small stacked substrate 420 having a first surface 422 with a plurality of bond pads 424 disposed thereon and a second surface 426. The first small stacked substrate 420 is in electrical communication with the first stacked substrate surface 404 via a plurality of first small stacked substrate electric connections 428. The first small stacked substrate electric connections 428 extend between each first stacked substrate surface first bond pad 406 and its respective first small stacked substrate first surface bond pad 424. The bond pads of both the first stacked substrate 402 and first small stacked substrate 420 are preferably located such that each respective bond pad pair aligns perpendicularly. At least one second semiconductor die 430 having a face side 434 and a back side 432 is attached to the first small stacked substrate second surface 426 with a second layer of dielectric adhesive 436. The second semiconductor die 430 is in electric communication with a plurality of first small stacked substrate electrical traces (not shown) via wirebonds 438.

The variable stack size assembly 400 still further includes a second stacked substrate 440 having a first surface 442 with a plurality of bond pads 444 thereon and a second surface 446 with a plurality of bond pads 448. The second stacked substrate 440 is in electrical communication with the first stacked substrate surface 404 via a plurality of first electric connections 450. The first electric connections 450 extend between each second stacked substrate first surface bond pad 444 and its respective first stacked substrate second surface bond pad 408. The bond pads of both the second stacked substrate 440 and first stacked substrate 402 are preferably located such that each respective bond pad pair aligns perpendicularly.

A plurality of third semiconductor dice 452 each having a face side 454 and a back side 456 is attached to the second stacked substrate second surface 446 with a third layer of dielectric adhesive 458 applied to the third semiconductor die back sides 456. The third semiconductor dice 452 are in electric communication with a plurality of second stacked substrate electrical traces (not shown) via wirebonds 460.

The variable stack size assembly 400 still further includes a third stacked substrate 462 having a first surface 464 with a plurality of bond pads 466 thereon and a second surface 468 with a plurality of bond pads 470 thereon. The third stacked substrate 462 is in electrical communication with the second stacked substrate second surface 446 via a plurality of second electric connections 472. The second electric connections 472 extend between each third stacked substrate first surface bond pad 466 and its respective second stacked substrate second surface bond pad 448. The bond pads of both the third stacked substrate 462 and second stacked substrate 440 are preferably located such that each respective bond pad pair aligns perpendicularly.

A plurality of fourth semiconductor dice 474 each having a face side 476 and a back side 478 is attached to the third stacked substrate first surface 464 with a fourth layer of dielectric adhesive 480 applied to the fourth semiconductor die back sides 478. The fourth semiconductor dice 474 are in electrical contact with a plurality of third stacked substrate electrical traces (not shown) via wirebonds 482. A plurality of fifth semiconductor dice 484 each having a face side 486 and a back side 488 is attached to the third stacked substrate second surface 468 with a fifth layer of dielectric adhesive 490 applied to the fifth semiconductor die back sides 488. The fifth semiconductor dice 484 are in electric communication with a plurality of third stacked substrate electrical traces (not shown) via wirebonds 492.

The variable stack size assembly 400 further includes a second small stacked substrate 494 having a first surface 496 with a plurality of bond pads 498 disposed thereon and a second surface 500. The second small stacked substrate 494 is in electrical communication with the third substrate second surface 468 via a plurality of second small substrate electric connections 502. The second small substrate electric connections 502 extend between each second small stacked substrate first surface bond pad 498 and its respective third stacked substrate second surface bond pad 470. The bond pads of both the second small stacked substrate 494 and third stacked substrate 462 are preferably located such that each respective bond pad pair aligns perpendicularly. At least one sixth semiconductor die 504 having a face side 506 and a back side 508 is attached to the second small stacked substrate first surface 496 with a sixth layer of dielectric adhesive 510. The sixth semiconductor die 504 is in electric communication with a plurality of second small stacked substrate electrical traces (not shown) via wirebonds 512. At least one seventh semiconductor die 514 having a face side 516 and a back side 518 is attached to the second small stacked substrate second surface 500 with a seventh layer of dielectric adhesive 520. The seventh semiconductor die 514 is in electric communication with a plurality of second small stacked substrate electrical traces (not shown) via wirebonds 522. Although the electrical traces of the substrates have not been illustrated, it is understood that electrical traces make electrical connections in the same manner as described for FIG. 1.

Figure 5:
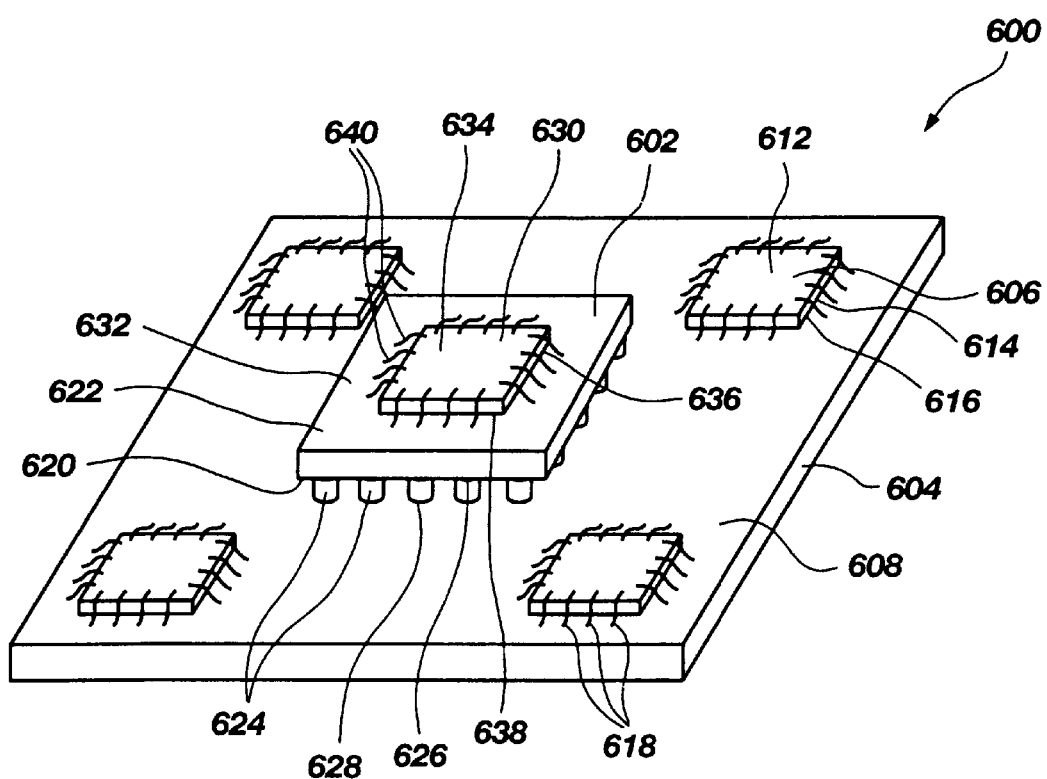
FIG. 5 is a perspective view of a variable stack size assembly of the present invention.

FIG. 5 illustrates a substrate assembly 600 having a smaller substrate 602 on a larger substrate 604, such as shown as third stacked substrate 462 and second small stacked substrate 494 in FIG. 4. The substrate assembly 600 comprises the larger substrate 604 having a plurality of first semiconductor dice 606 and the smaller substrate 602 disposed on a surface 608 of the larger substrate 604. The first semiconductor dice 606 have a face side 612 and a back side 614. The first semiconductor dice 606 are attached by a first layer of adhesive 616 applied to the semiconductor dice back side 614 and make electrical contact with the substrate surface 608 by a plurality of first bond wires 618. The smaller substrate 602 has a first surface 620 and a second surface 622. The smaller substrate 602 has a plurality of electrical contacts 624 extending between a plurality of bond pads 626 on the smaller substrate first surface 620 and a plurality of bond pads 628 on the larger substrate surface 608. A plurality of second semiconductor dice 630 (only one shown) is disposed on the smaller substrate second surface 622. The second semiconductor dice 630 have a face side 634 and a back side 636. The second semiconductor dice 630 are attached by a second layer of adhesive 638 applied to the second semiconductor dice back side 636 and make electrical contact with the smaller substrate second surface 622 by a plurality of bond wires 640. Although the electrical traces of the smaller substrate have not been illustrated, it is understood that electrical traces make electrical connections in the same manner as described for FIG. 1.

Figure 6:
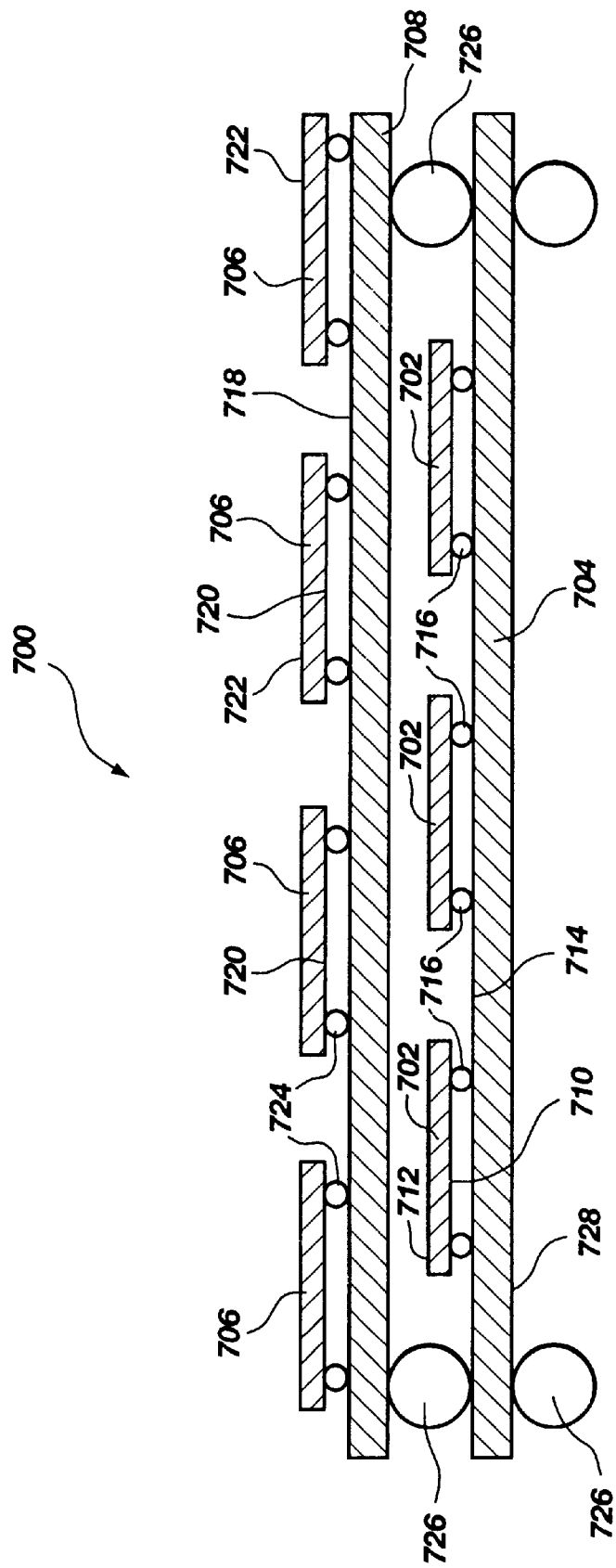
FIG. 6 is a cross-sectional view of a variable stack size assembly of the present invention using flip chip bonding techniques.

FIG. 6 illustrates a substrate assembly 700 having a plurality of semiconductor devices mounted on substrates using known flip chip attachment techniques. The substrate assembly 700 comprises a first substrate 704 having a plurality of first semiconductor dice 702 disposed thereon and a second substrate 708 having a plurality of second semiconductor dice 706 disposed thereon. The first semiconductor dice 702 each have a surface or face side 710 having a plurality of bond pads (not shown) thereon and a back side 712. The first semiconductor dice 702 make electrical contact with the traces (not shown) on the first substrate surface 714 by a plurality of first conductive material balls 716 extending between the bond pads (not shown) on the face surface 710 of the dice 702 and the traces (not shown) on the first substrate surface 714. The balls 716 may be made of any suitable conductive material to connect the semiconductor dice 702 to the conductive traces on first substrate 704, such as solder, conductive epoxy, etc. The balls 716 are shown as generally spherical in shape, although they may be any suitable geometric shape and size for bonding purposes. Further, z-axis connectors may be substituted for the balls 716 if so desired. The second substrate 708 has a surface 718 having a plurality of conductive traces (not shown) thereon. The second plurality of semiconductor dice 706 each have a face side 720 having a plurality of bond pads (not shown) thereon and a back side 722. The second plurality of semiconductor dice 706 make electrical contact with the second substrate surface 718 by a plurality of second conductive material balls 724 extending between the bond pads of the dice 706 and the conductive traces on the second substrate surface 718. The balls 724 may be made of any suitable conductive material to connect the semiconductor dice 706 to the conductive traces on second substrate 708, such as solder, conductive epoxy, etc. The balls 724 are shown as generally spherical in shape, although they may be any suitable geometric shape and size for bonding purposes. Further, z-axis connectors may be substituted for balls 724 if so desired. The desired conductive traces on the surface 714 of the first substrate 704 are connected to the desired conductive traces on the surface 718 of the second substrate 708 by larger conductive balls 726. The larger conductive balls 726 may be of any suitable conductive material, such as solder, conductive epoxy, etc. The larger conductive balls are also used for connecting the surface 728 of the first substrate 704 to any other desired substrate. Further, z-axis connectors may be substituted for balls 726 if so desired. It should be understood that the conductive traces which have only been referred to on the surfaces 714 and 718 of the substrates may be formed on either side of the first substrate 704 or the second substrate 708 and, as such, have not been illustrated. Also, any connectors extending through the first substrate 704 and second substrate 708 for connection purposes have not been shown. Similarly, the bond pads on the first semiconductor dice 702 and second semiconductor dice 706 have not been illustrated. The first semiconductor dice 702 are attached to the first substrate 704 and the second semiconductor dice 706 are attached to the second substrate 708 by well known flip-chip bonding techniques, depending upon the type of conductive balls 716 and 724 used for connection purposes.

FIGS. 4, 5 and 6, as shown, illustrate complete electrical components. As an example, the smaller stacked substrates (i.e., first small stacked substrate 420 and second small stacked substrate 494 of FIG. 4, and smaller substrate 602 of FIG. 5) could be memory modules containing a plurality of memory chips. These smaller stacked substrates or semiconductor devices are connected to the larger substrates (i.e., first stacked substrate 402 and third stacked substrate 462 of FIG. 4, larger substrate 604 of FIG. 5 or first semiconductor dice 702 stacked on first substrate 704 and second semiconductor devices 706 stacked on second substrate 708 of FIG. 6), which could be the motherboard portions with control logic circuits and a central processing unit(s). Thus, the combination of these example components could constitute a complete component. However, it is, of course, understood that the embodiments shown in FIGS. 4, 5 and 6 could include electric connections (such as electric connections 114 of FIG. 1) to connect to other components or other substrates.

Having thus described in detail preferred embodiments of the present invention, it is to be understood that the invention defined by the appended claims is not to be limited by particular details set forth in the above description as many apparent variations thereof are possible without departing from the spirit or scope thereof.

What is claimed is:

1. A semiconductor assembly, comprising:
 a base substrate having a first surface including a plurality of bond pads;
 a first stacked substrate having a first surface and a second surface wherein at least one of said first stacked substrate first surface and second surface includes a plurality of bond pads;
 at least one first semiconductor die disposed on said first surface of said first stacked substrate, wherein said at least one first semiconductor die includes a plurality of bond pads;
 an at least one second semiconductor die having a first surface facing said base substrate first surface and having a plurality of bond pads on said at least one second semiconductor die first surface, said at least one second semiconductor die disposed on said second surface of said first stacked substrate;

at least one first intercoupler electrically coupled between at least one of said plurality of first stacked substrate first surface bond pads and first stacked substrate second surface bond pads, and at least one of said plurality of first semiconductor die bond pads;

at least one second intercoupler extending between and electrically coupling said base substrate and said first stacked substrate, wherein said at least one second intercoupler physically positions said first stacked substrate in a substantially parallel spaced relationship relative to said base substrate;

a second stacked substrate having a first surface and a second surface, each including a plurality of bond pads;

at least one third semiconductor die disposed on said first surface of said second stacked substrate, said at least one third semiconductor die having a plurality of bond pads located thereon;

at least one fourth semiconductor die disposed on said second surface of said second stacked substrate, said at least one fourth semiconductor die having a plurality of bond pads located thereon;

at least one fourth intercoupler electrically coupled between at least one of said plurality of second stacked substrate first surface bond pads and said plurality of second stacked substrate second surface bond pads, and at least one of said plurality of fourth semiconductor die bond pads; and at least one fifth intercoupler extending between and electrically coupling said second stacked substrate and one of said first stacked substrate first surface, said first stacked substrate second surface, and said base substrate first surface, wherein said at least one fifth intercoupler separates said second stacked substrate from said first stacked substrate first surface, said first stacked substrate second surface, or said base substrate first surface.

2. The semiconductor assembly of claim 1, wherein said at least one second intercoupler is disposed intermediate at least one of said plurality of first stacked substrate first surface bond pads and said plurality of first stacked substrate second surface bond pads, and at least one of said plurality of base substrate bond pads.

3. The semiconductor assembly of claim 1, wherein said at least one first intercoupler is electrically coupled between at least one second semiconductor die bond pad and at least one first semiconductor bond pad.

4. The semiconductor assembly of claim 1, wherein said at least one first semiconductor die is physically and electrically coupled to said first stacked substrate first surface.

5. The semiconductor assembly of claim 1, wherein said first stacked substrate second surface includes a plurality of bond pads; and wherein said at least one first semiconductor die is physically and electrically coupled to said first stacked substrate second surface.

6. The semiconductor assembly of claim 1, wherein said at least one first intercoupler is selected from the group consisting of solder, conductive adhesives, Z-axis conductive material, flex-contacts, spring contacts, wire bonds, and TAB tape.

7. The semiconductor assembly of claim 1, wherein said base substrate further comprises a second surface wherein said base substrate second surface includes a plurality of bond pads.

8. The semiconductor assembly of claim 7, further comprising electrical connections attached to said plurality of base substrate second surface bond pads for electrical communication with external circuitry.

9. The semiconductor assembly of claim 8, further comprising a plurality of base substrate trace leads for electrical communication between said plurality of base substrate first surface bond pads and said plurality of base substrate second surface bond pads.

10. The semiconductor assembly of claim 1, further comprising:

at least one base semiconductor die having a plurality of bond pads and disposed on said base substrate first surface; and at least one third intercoupler electrically coupled between at least one of said plurality of base substrate first surface bond pads and at least one of said plurality of base semiconductor die bond pads.

11. A semiconductor assembly comprising:

a base substrate having a first surface including a plurality of bonds pads thereon, a second surface including a plurality of bond pads thereon, and a plurality of traces, at least one trace of said plurality of traces connecting at least one bond pad of said plurality of bond pads on said base substrate first surface to at least one bond pad of said plurality of bond pads on said base substrate second surface;

a first stacked substrate having a first surface including a plurality of bond pads thereon, a second surface including a plurality of bond pads thereon, a first plurality of traces, at least one trace of said first plurality of traces connecting at least one bond pad of said plurality of bond pads on said first stacked substrate first surface to at least one bond pad of said plurality of bond pads on said first stacked substrate second surface, and a second plurality of traces, at least one trace of said second plurality of traces connected to another bond pad of said plurality of bond pads on said first surface of said first stacked substrate;

at least one first semiconductor die disposed on said first surface of said first stacked substrate, said at least one first semiconductor die connected to said at least one trace of said second plurality of traces connected to another bond pad of said plurality of bond pads on said first surface of said first stacked substrate;

a second stacked substrate having a first surface including a plurality of bond pads thereon, a second surface including a plurality of bond pads thereon, a first plurality of traces, at least one trace of said first plurality of traces connecting at least one bond pad of said plurality of bond pads on said second stacked substrate first surface to at least one bond pad of said plurality of bond pads on said second stacked substrate second surface, and a second plurality of traces, at least one trace of said second plurality of traces connected to another bond pad of said plurality of bond pads on said first surface of said second stacked substrate;

at least one second semiconductor die disposed on said first surface of said second stacked substrate, said at least one second semiconductor die connected to said at least one trace of said second plurality of traces connected to another bond pad of said plurality of bond pads on said first surface of said second stacked substrate;

at least one third semiconductor die disposed on said second surface of said second stacked substrate;

a first plurality of connections extending between said base substrate and said first stacked substrate, at least one connection of said first plurality of connections connecting said at least one bond pad on said first surface of said base substrate to at least one bond pad of the plurality of bond pads on the first surface of said first stacked substrate;

a second plurality of connections extending between said second stacked substrate and said first stacked substrate, at least one connection of said second plurality of connections connecting said at least one bond pad on said first surface of said second stacked substrate to at least one bond pad of the plurality of bond pads on the second surface of said first stacked substrate;

a third stacked substrate having a first surface including a plurality of bond pads thereon, a second surface including a plurality of bond pads thereon, a first plurality of traces, at least one trace of said first plurality of traces connecting at least one bond pad of said plurality of bond pads on said third stacked substrate first surface to at least one bond pad of said plurality of bond pads on said third stacked substrate second surface, and a second plurality of traces, at least one trace of said second plurality of traces connected to another bond pad of said plurality of bond pads on said first surface of said third stacked substrate;

at least one fourth semiconductor die disposed on said second surface of said third stacked substrate;

at least one fifth semiconductor die disposed on said first surface of said third stacked substrate, said at least one fifth semiconductor die connected to said at least one trace of said second plurality of traces connected to another bond pad of said plurality of bond pads on said first surface of said third stacked substrate; and a third plurality of connections extending between said third stacked substrate and said second stacked substrate, at least one connection of said third plurality of connections connecting said at least one bond pad of said plurality of bond pads on said first surface of said third stacked substrate to at least one bond pad of the plurality of bond pads on the first surface of said second stacked substrate.

12. The semiconductor assembly of claim 11, wherein said first plurality of connections extending between said base substrate and said first stacked substrate support said first sacked substrate.

13. The semiconductor assembly of claim 11, wherein said second plurality of connections extending between said first stacked substrate and said second stacked substrate support said second stacked substrate.

14. The semiconductor assembly of claim 11, wherein said first plurality of connections is selected from the group consisting of solder, conductive adhesives, Z-axis conductive material, flex-contacts, spring contacts, wire bonds, and TAB tape.

15. The semiconductor assembly of claim 11, wherein said second plurality of connections is selected from the group consisting of solder, conductive adhesives, Z-axis conductive material, flex-contacts, spring contacts, wire bonds, and TAB tape.

16. The semiconductor assembly of claim 11, said assembly further comprising:

a fourth plurality of connections, at least one connection of said third plurality of connections connecting said at least one bond pad on said second surface of said base substrate to external circuitry.

17. The semiconductor assembly of claim 11, wherein said at least one first semiconductor die disposed on said first surface of said first stacked substrate is connected to said at least one trace of said second plurality of traces connected to another bond pad of said plurality of bond pads on said first surface of said first stacked substrate through flip chip attachment, wirebonding, TAB tape, or a combination thereof.

18. The semiconductor assembly of claim 11, wherein said at least one second semiconductor die disposed on said first surface of said second stacked substrate is connected to said at least one trace of said second plurality of traces connected to another bond pad of said plurality of bond pads on said first surface of said second stacked substrate through flip chip attachment, wirebonding, TAB tape, or a combination thereof.

19. The semiconductor assembly of claim 11, wherein said at least one third semiconductor die disposed on said second surface of said second stacked substrate is connected to at least one bond pad of said plurality of bond pads on said second surface of said second stacked substrate.

20. The semiconductor assembly of claim 11, wherein said at least one third semiconductor die disposed on said second surface of said second stacked substrate is connected to at least one bond pad of said plurality of bond pads on said first surface of said second stacked substrate.

21. The semiconductor assembly of claim 11, wherein said at least one second semiconductor die disposed on said first surface of said second stacked substrate is connected to at least one bond pad of said plurality of bond pads on said second surface of said second stacked substrate and wherein said at least one third semiconductor die disposed on said second surface of said second stacked substrate is connected to at least one bond pad of said plurality of bond pads on said second surface of said second stacked substrate.

22. The semiconductor assembly of claim 11, further comprising:

a small fourth stacked substrate having a first surface including a plurality of bond pads thereon, a second surface including a plurality of bond pads thereon, a first plurality of traces, at least one trace of said first plurality of traces connecting at least one bond pad of said plurality of bond pads on said fourth stacked substrate first surface to at least one bond pad of said plurality of bond pads on said fourth stacked substrate second surface, and a second plurality of traces, at least one trace of said second plurality of traces connected to another bond pad of said plurality of bond pads on said first surface of said fourth stacked substrate, said small fourth stacked substrate located above said second stacked substrate;

at least one sixth semiconductor die disposed on said first surface of said fourth small stacked substrate, said at least one sixth semiconductor die connected to said at least one trace of said second plurality of traces connected to another bond pad of said plurality of bond pads on said first surface of said fourth stacked substrate; and a fourth plurality of connections extending between said fourth small stacked substrate and said second stacked substrate, at least one connection of said fourth plurality of connections connecting said at least one bond pad on said first surface of said fourth stacked substrate to at least one bond pad of the plurality of bond pads on the first surface of said second stacked substrate.

23. A semiconductor assembly comprising:

a base substrate having a first surface including a plurality of bonds pads thereon, a second surface including a plurality of bond pads thereon, and a plurality of traces, at least one trace of said plurality of traces connecting at least one bond pad of said plurality of bond pads on said base substrate first surface to at least one bond pad of said plurality of bond pads on said base substrate second surface;

a first stacked substrate having a first surface including a plurality of bond pads thereon, a second surface including a plurality of bond pads thereon, a first plurality of traces, at least one trace of said first plurality of traces connecting at least one bond pad of said plurality of bond pads on said first stacked substrate first surface to at least one bond pad of said plurality of bond pads on said first stacked substrate second surface, and a second plurality of traces, at least one trace of said second plurality of traces connected to another bond pad of said plurality of bond pads on said first surface of said first stacked substrate;

a plurality of first semiconductor dice disposed on said first surface of said first stacked substrate, each die of said plurality of first semiconductor dice connected to said at least one trace of said second plurality of traces connected to another bond pad of said plurality of bond pads on said first surface of said first stacked substrate;

a second stacked substrate having a first surface including a plurality of bond pads thereon, a second surface including a plurality of bond pads thereon, a first plurality of traces, at least one trace of said first plurality of traces connecting at least one bond pad of said plurality of bond pads on said second stacked substrate first surface to at least one bond pad of said plurality of bond pads on said second stacked substrate second surface, and a second plurality of traces, at least one trace of said second plurality of traces connected to another bond pad of said plurality of bond pads on said first surface of said second stacked substrate;

a plurality of second semiconductor dice disposed on said first surface of said second stacked substrate, each die of said plurality of second semiconductor dice connected to said at least one trace of said second plurality of traces connected to another bond pad of said plurality of bond pads on said first surface of said second stacked substrate;

a plurality of third semiconductor dice disposed on said second surface of said second stacked substrate;

a first plurality of connections extending between said base substrate and said first stacked substrate, at least one connection of said first plurality of connections connecting said at least one bond pad on said first surface of said base substrate to at least one bond pad of the plurality of bond pads on the first surface of said first stacked substrate;

a second plurality of connections extending between said second stacked substrate and said first stacked substrate, at least one connection of said second plurality of connections connecting said at least one bond pad on said first surface of said second stacked substrate to at least one bond pad of the plurality of bond pads on the second surface of said first stacked substrate;

a third stacked substrate having a first surface including a plurality of bond pads thereon, a second surface including a plurality of bond pads thereon, a first plurality of traces, at least one trace of said first plurality of traces connecting at least one bond pad of said plurality of bond pads on said third stacked substrate first surface to at least one bond pad of said plurality of bond pads on said third stacked substrate second surface, and a second plurality of traces, at least one trace of said second plurality of traces connected to another bond pad of said plurality of bond pads on said first surface of said third stacked substrate;

a plurality of fourth semiconductor dice disposed on said first surface of said third stacked substrate, each die of said third plurality of third semiconductor dice connected to said at least one trace of said second plurality of traces connected to another bond pad of said plurality of bond pads on said first surface of said third stacked substrate;

a plurality of fifth semiconductor dice disposed on said second surface of said third stacked substrate; and a third plurality of connections extending between said third stacked substrate and said second stacked substrate, at least one connection of said third plurality of connections connecting said at least one bond pad on said first surface of said third stacked substrate to at least one bond pad of the plurality of bond pads on the first surface of said second stacked substrate.

24. The semiconductor assembly of claim 23, wherein said first plurality of connections extending between said base substrate and said first stacked substrate support said first stacked substrate.

25. The semiconductor assembly of claim 23, wherein said second plurality of connections extending between said first stacked substrate and said second stacked substrate support said second stacked substrate.

26. The semiconductor assembly of claim 23, wherein said first plurality of connections is selected from the group consisting of solder, conductive adhesives, Z-axis conductive material, flex-contacts, spring contacts, wire bonds, and TAB tape.

27. The semiconductor assembly of claim 23, wherein said second plurality of connections is selected from the group consisting of solder, conductive adhesives, Z-axis conductive material, flex-contacts, spring contacts, wire bonds, and TAB tape.

28. The semiconductor assembly of claim 23, said assembly further comprising:

a third plurality of connections, at least one connection of said third plurality of connections connecting said at least one bond pad on said second surface of said base substrate to external circuitry.

29. The semiconductor assembly of claim 23, wherein each die of said first plurality of semiconductor dice disposed on said first surface of said first stacked substrate is connected to said at least one trace of said second plurality of traces connected to another bond pad of said plurality of bond pads on said first surface of said first stacked substrate through flip chip attachment, wirebonding, TAB tape, or a combination thereof.

30. The semiconductor assembly of claim 23, wherein said each die of said second plurality of semiconductor die disposed on said first surface of said second stacked substrate is connected to said at least one trace of said second plurality of traces connected to another bond pad of said plurality of bond pads on said first surface of said second stacked substrate through flip chip attachment, wirebonding, TAB tape, or a combination thereof.

31. The semiconductor assembly of claim 23, further comprising:

at least one second semiconductor die disposed on said second surface of said first stacked substrate, said second semiconductor die connected to at least one bond pad of said plurality of bond pads on said second surface of said first stacked substrate.

32. The semiconductor assembly of claim 23, further comprising:

at least one second semiconductor die disposed on said second surface of said first stacked substrate, said second semiconductor die connected to at least one bond pad of said plurality of bond pads on said second surface of said first stacked substrate; and at least one second semiconductor die disposed on said second surface of said second stacked substrate, said second semiconductor die connected to at least one bond pad of said plurality of bond pads on said second surface of said second stacked substrate.

* * * * *

UNITED STATES PATENT AND TRADEMARK OFFICE
CERTIFICATE OF CORRECTION

PATENT NO.  : 6,051,878
DATED       : April 18, 2000
INVENTOR(S) : Akram et al.

It is certified that error appears in the above-identified patent and that said Letters Patent is hereby corrected as shown below:

| | | |
|---|---|---|
| On the Title Page, | Section [54], | change "METHOD OF CONSTRUCTING STACKED PACKAGES" to --STACKED MULTI-SUBSTRATE SEMICONDUCTOR PACKAGE--; |
| | Column 1, lines 1-2, | changed "METHOD OF CONSTRUCTING STACKED PACKAGES" to --STACKED MULTI-SUBSTRATE SEMICONDUCTOR PACKAGE--; |
| | Column 1, lines 15-16, | change "chip on board" to --chip-on-board--; |
| | Column 1, line 19, | change "Chip On Board" to --Chip-on-board--; |
| | Column 1, line 20, | change "flip chip" to --flip-chip--; |
| | Column 1, line 22, | change "Flip chip" to --Flip-chip--; |
| | Column 3, line 7, | delete "," after "Jul."; |
| | Column 3, line 28, | change "Wether" to --Werther--; |
| | Column 3, line 29, | change "Wether" to --Werther--; |
| | Column 3, line 44, | change "chip on board" to --chip-on-board--; |
| | Column 4, line 13, | change "flip chip" to --flip-chip--; |
| | Column 5, line 54, | change "flip chip" to --flip-chip--; |
| | Column 6, line 51, | change "flip chip" to --flip-chip--; |
| | Column 6, line 52, | change "flip chip" to --flip-chip--; |

UNITED STATES PATENT AND TRADEMARK OFFICE
CERTIFICATE OF CORRECTION

PATENT NO. : 6,051,878
DATED : April 18, 2000
INVENTOR(S) : Akram et al.

It is certified that error appears in the above-identified patent and that said Letters Patent is hereby corrected as shown below:

Column 6, line 59,     change "flip chip" to --flip-chip--;

Column 6, line 64,     change "stack" to --stacked--;

Column 6, line 66,     change "stack" to --stacked--;

Column 9, line 35,     change "flip chip" to --flip-chip--;

Column 10, line 36,     delete "devices" and insert --dice-- therefor;

Claim 12, Column 13, line 45,     change "sacked" to --stacked--;

Claim 16, Column 13, line 63,     change "third" to --fourth--;

Claim 17, Column 14, line 6,     change "flip chip" to --flip-chip--;

Claim 18, Column 14, line 15,     change "flip chip" to --flip-chip--;

Claim 29, Column 16, line 56,     change "flip chip" to --flip-chip--; and

Claim 30, Column 16, line 64,     change "flip chip" to --flip-chip--.

Signed and Sealed this

Tenth Day of April, 2001

*Attest:*

NICHOLAS P. GODICI

*Attesting Officer*     *Acting Director of the United States Patent and Trademark Office*